United States Patent
Guarin Aristizabal et al.

(10) Patent No.: US 11,815,620 B2
(45) Date of Patent: Nov. 14, 2023

(54) DIGITALLY MODULATED RADAR TRANSMITTER MODULES, SYSTEMS AND METHODS

(71) Applicant: NXP USA, INC., Austin, TX (US)

(72) Inventors: Gustavo Guarin Aristizabal, Munich (DE); Ralf Reuter, Landshut (DE); Maik Brett, Taufkirchen (DE)

(73) Assignee: NXP USA, INC., Austin, TX (US)

( * ) Notice: Subject to any disclaimer, the term of this patent is extended or adjusted under 35 U.S.C. 154(b) by 174 days.

(21) Appl. No.: 17/083,795

(22) Filed: Oct. 29, 2020

(65) Prior Publication Data

US 2021/0132186 A1     May 6, 2021

(30) Foreign Application Priority Data

Nov. 5, 2019   (EP) .................................... 19207102

(51) Int. Cl.
| | | |
|---|---|---|
| G01S 7/282 | (2006.01) | |
| G01S 13/26 | (2006.01) | |
| H04L 27/20 | (2006.01) | |

(52) U.S. Cl.
CPC ............... *G01S 7/282* (2013.01); *G01S 13/26* (2013.01); *H04L 27/20* (2013.01)

(58) Field of Classification Search
CPC ...... G01S 13/26; G01S 13/282; G01S 13/284; G01S 13/286; G01S 13/288; G01S 13/32; G01S 13/325; G01S 13/34; G01S 2013/0254; G01S 2013/0245; G01S 7/0234; G01S 7/023; G01S 7/0233; G01S 7/282; G01S 7/285; G01S 7/032

USPC ............. 342/23, 372, 368, 81, 157, 100
See application file for complete search history.

(56) References Cited

U.S. PATENT DOCUMENTS

| | | | | |
|---|---|---|---|---|
| 3,883,870 A | * | 5/1975 | Kunz | G01S 7/4052 |
| | | | | 342/174 |
| 4,157,545 A | * | 6/1979 | O'Farrell | G01S 13/30 |
| | | | | 342/378 |
| 4,358,741 A | * | 11/1982 | Nardin | H03H 17/08 |
| | | | | 331/25 |
| 4,937,580 A | * | 6/1990 | Wills | G01V 3/12 |
| | | | | 342/22 |

(Continued)

FOREIGN PATENT DOCUMENTS

| | | | | |
|---|---|---|---|---|
| EP | 1891700 B1 | * | 2/2013 | ......... G01S 13/0209 |
| GB | 2046543 A | * | 11/1980 | ......... G01S 13/0209 |

OTHER PUBLICATIONS

Griffiths, H., "Radar Spectrum Engineering and Management: Technical and Regulatory Issues", Proceeding of the IEEE, vol. 103, No. 1, Jan. 1, 2015.

*Primary Examiner* — Timothy A Brainard
*Assistant Examiner* — Michael W Justice

(57) ABSTRACT

A digitally modulated radar, DMR, transmitter module is disclosed comprising: a sequence generator, configured to generate a repeating digital sequence signal based on a relatively low-frequency clock signal; a mixer configured to combine the digital sequence signal with at least one phase-delayed copy of the digital sequence signal, to provide a combined signal; and a modulator configured to modulate a relatively high-frequency carrier signal, in dependence on the combined signal, to provide a modulated signal. Corresponding systems and methods are also disclosed.

20 Claims, 8 Drawing Sheets

(56) References Cited

U.S. PATENT DOCUMENTS

| | | | | |
|---|---|---|---|---|
| 5,289,252 | A * | 2/1994 | Nourrcier | G01S 7/484 356/28.5 |
| 5,337,052 | A * | 8/1994 | Lohrmann | G01S 7/038 102/214 |
| 5,793,798 | A * | 8/1998 | Rudish | H01Q 3/30 375/138 |
| 5,861,834 | A * | 1/1999 | Sauer | G01S 13/32 342/194 |
| 6,054,948 | A * | 4/2000 | Dean | G01S 7/032 342/372 |
| 6,147,560 | A * | 11/2000 | Erhage | H03L 7/02 329/307 |
| 6,163,564 | A * | 12/2000 | Rudish | G01S 13/325 370/204 |
| 6,317,074 | B1 * | 11/2001 | Johnson | H03B 23/00 342/128 |
| 6,384,772 | B1 * | 5/2002 | Bradley | G01S 7/4052 342/170 |
| 6,441,783 | B1 * | 8/2002 | Dean | G01S 7/032 342/372 |
| 6,611,224 | B1 * | 8/2003 | Nysen | G06K 19/0672 342/175 |
| 6,670,909 | B2 * | 12/2003 | Kim | H01Q 25/00 342/21 |
| 6,809,586 | B1 * | 10/2004 | Hobboosh | H03F 3/2175 330/10 |
| 7,075,476 | B2 * | 7/2006 | Kim | H01Q 25/00 342/21 |
| 7,116,726 | B2 * | 10/2006 | Winkler | H04L 27/368 375/296 |
| 7,158,077 | B2 * | 1/2007 | Brosche | G01S 7/0231 342/134 |
| 7,190,729 | B2 * | 3/2007 | Siwiak | H04L 27/0014 375/259 |
| 7,206,334 | B2 * | 4/2007 | Siwiak | H04L 27/0014 375/295 |
| 7,259,716 | B1 * | 8/2007 | Dubbert | G01S 7/28 342/131 |
| 7,394,846 | B2 * | 7/2008 | Siwiak | H04L 27/0014 375/295 |
| 7,548,181 | B1 * | 6/2009 | Bausov | G01V 3/12 342/159 |
| 7,642,952 | B2 * | 1/2010 | Fukuda | G01S 7/35 342/134 |
| 7,714,777 | B2 * | 5/2010 | Fukuda | G01S 13/325 342/134 |
| 7,787,513 | B2 * | 8/2010 | Siwiak | H04L 5/026 375/135 |
| 8,188,911 | B2 * | 5/2012 | Beasley | H01Q 21/065 342/84 |
| 8,248,297 | B1 * | 8/2012 | Baker | G01S 7/4052 342/174 |
| 8,362,944 | B2 * | 1/2013 | Lancashire | H01Q 3/36 342/134 |
| 8,405,544 | B2 * | 3/2013 | Nakagawa | G01S 13/937 342/146 |
| 8,780,955 | B2 * | 7/2014 | Fukuda | G01S 7/023 375/150 |
| 8,811,535 | B2 * | 8/2014 | Brodzik | H04L 27/2626 435/5 |
| 8,885,774 | B2 * | 11/2014 | Stirling-Gallacher | H01Q 3/38 375/322 |
| 8,965,727 | B2 * | 2/2015 | Rzyski | H03F 1/3223 330/149 |
| 8,989,690 | B2 * | 3/2015 | Devries | H04B 1/1036 455/226.1 |
| 9,031,163 | B2 * | 5/2015 | Matsuo | H04L 1/0033 375/299 |
| 9,081,085 | B2 * | 7/2015 | Fukuda | G01S 13/0209 |
| 9,213,091 | B2 * | 12/2015 | Kishigami | G01S 7/282 |
| 9,945,935 | B2 * | 4/2018 | Eshraghi | G01S 13/325 |
| 10,191,142 | B2 * | 1/2019 | Eshraghi | G01S 13/325 |
| 10,191,143 | B2 * | 1/2019 | Jaeger | G01S 7/4021 |
| 10,284,236 | B1 * | 5/2019 | Trotta | H04B 1/30 |
| 10,317,512 | B2 * | 6/2019 | Trotta | G01S 13/0209 342/28 |
| 10,408,919 | B2 * | 9/2019 | Trotta | G01S 13/87 |
| 10,564,274 | B2 * | 2/2020 | Delos | G01S 13/325 |
| 10,725,150 | B2 * | 7/2020 | Trotta | G01S 7/0231 342/134 |
| 10,794,993 | B2 * | 10/2020 | Jaeger | H04L 27/2647 375/260 |
| 10,871,561 | B2 * | 12/2020 | Fox | H03B 23/00 342/128 |
| 11,031,978 | B2 * | 6/2021 | Klemmer | H04B 7/0421 |
| 11,054,499 | B2 * | 7/2021 | Murali | G01S 7/4021 |
| 11,079,471 | B2 * | 8/2021 | Guarin Aristizabal | G01S 13/931 |
| 11,115,864 | B2 * | 9/2021 | Perez-Ramirez | H04L 43/16 |
| 11,158,944 | B2 * | 10/2021 | Schrattenecker | G01S 13/343 |
| 11,360,185 | B2 * | 6/2022 | Jungmaier | G01S 7/032 |
| 11,415,668 | B2 * | 8/2022 | Gruber | G01S 7/4052 |
| 2002/0130809 | A1 * | 9/2002 | Kim | H01Q 25/00 340/3.1 |
| 2004/0017840 | A1 * | 1/2004 | Siwiak | H04B 1/71632 375/147 |
| 2004/0017841 | A1 * | 1/2004 | Siwiak | H04L 27/0014 375/147 |
| 2004/0028146 | A1 * | 2/2004 | Winkler | H04L 27/2647 375/260 |
| 2004/0061640 | A1 * | 4/2004 | Cornic | G01S 7/282 342/72 |
| 2004/0090361 | A1 * | 5/2004 | Brosche | G01S 7/36 342/194 |
| 2004/0136438 | A1 | 7/2004 | Fullerton et al. | |
| 2004/0140925 | A1 * | 7/2004 | Kim | G01S 13/0209 342/28 |
| 2004/0165686 | A1 * | 8/2004 | Siwiak | H04L 27/0014 375/350 |
| 2004/0174928 | A1 * | 9/2004 | Siwiak | H04B 1/71635 375/146 |
| 2004/0227568 | A1 * | 11/2004 | Habboosh | H03F 3/2175 330/10 |
| 2007/0109175 | A1 * | 5/2007 | Fukuda | G01S 7/36 342/134 |
| 2007/0153877 | A1 * | 7/2007 | Siwiak | H04B 1/7174 375/295 |
| 2008/0204307 | A1 * | 8/2008 | Fukuda | G01S 7/032 342/175 |
| 2008/0278370 | A1 * | 11/2008 | Lachner | G01S 13/87 342/200 |
| 2009/0015464 | A1 * | 1/2009 | Fukuda | G01S 7/35 342/194 |
| 2009/0167589 | A1 * | 7/2009 | Bausov | G01S 13/32 342/22 |
| 2010/0265123 | A1 * | 10/2010 | Lancashire | G01S 13/904 342/372 |
| 2011/0013716 | A1 * | 1/2011 | Brodzik | H04L 27/2626 708/422 |
| 2012/0288033 | A1 * | 11/2012 | Stirling-Gallacher | G01S 7/03 375/322 |
| 2013/0135140 | A1 * | 5/2013 | Kishigami | G01S 7/282 342/202 |
| 2013/0314268 | A1 * | 11/2013 | Fukuda | G01S 13/584 342/21 |
| 2014/0023120 | A1 * | 1/2014 | Fukuda | G01S 13/325 375/140 |
| 2014/0192923 | A1 * | 7/2014 | Matsuo | H01Q 3/28 375/296 |
| 2015/0222344 | A1 | 8/2015 | Guermandi et al. | |
| 2016/0178730 | A1 * | 6/2016 | Trotta | G01S 13/931 342/175 |
| 2016/0306034 | A1 * | 10/2016 | Trotta | G01S 7/354 |
| 2017/0031005 | A1 * | 2/2017 | Jaeger | G01S 7/4021 |
| 2017/0212214 | A1 * | 7/2017 | Murali | G01S 7/4021 |
| 2017/0307728 | A1 * | 10/2017 | Eshraghi | G01S 7/282 |
| 2018/0003797 | A1 * | 1/2018 | Perez-Ramirez | G01S 7/021 |
| 2018/0074173 | A1 * | 3/2018 | Trotta | H01Q 9/0407 |
| 2018/0259619 | A1 * | 9/2018 | Eshraghi | G01S 13/87 |

(56) References Cited

U.S. PATENT DOCUMENTS

| | | | |
|---|---|---|---|
| 2019/0018127 A1 | 1/2019 | Aristizabal et al. | |
| 2019/0072657 A1* | 3/2019 | Delos | H01Q 3/2682 |
| 2019/0113601 A1* | 4/2019 | Trotta | G01S 13/931 |
| 2019/0154796 A1* | 5/2019 | Eshraghi | G01S 7/352 |
| 2019/0187245 A1* | 6/2019 | Guarin Aristizabal | H01Q 25/00 342/21 |
| 2019/0204413 A1* | 7/2019 | Jaeger | G01S 7/282 |
| 2019/0214724 A1* | 7/2019 | Schrattenecker | G01S 13/325 |
| 2020/0119780 A1* | 4/2020 | Klemmer | G01S 7/352 |
| 2020/0132825 A1* | 4/2020 | Jungmaier | G01S 7/36 342/194 |
| 2020/0300968 A1* | 9/2020 | Gruber | H03F 1/3223 330/149 |
| 2020/0348393 A1* | 11/2020 | Trotta | H04L 27/368 375/296 |
| 2021/0033701 A1* | 2/2021 | Jang | G01S 7/38 |
| 2021/0124014 A1* | 4/2021 | Mayer | G01S 7/40 |
| 2021/0132185 A1* | 5/2021 | Lin | G01S 13/343 |
| 2021/0333357 A1* | 10/2021 | Murali | G01S 13/931 |
| 2021/0391650 A1* | 12/2021 | Schrattenecker | G01S 7/4008 |

* cited by examiner

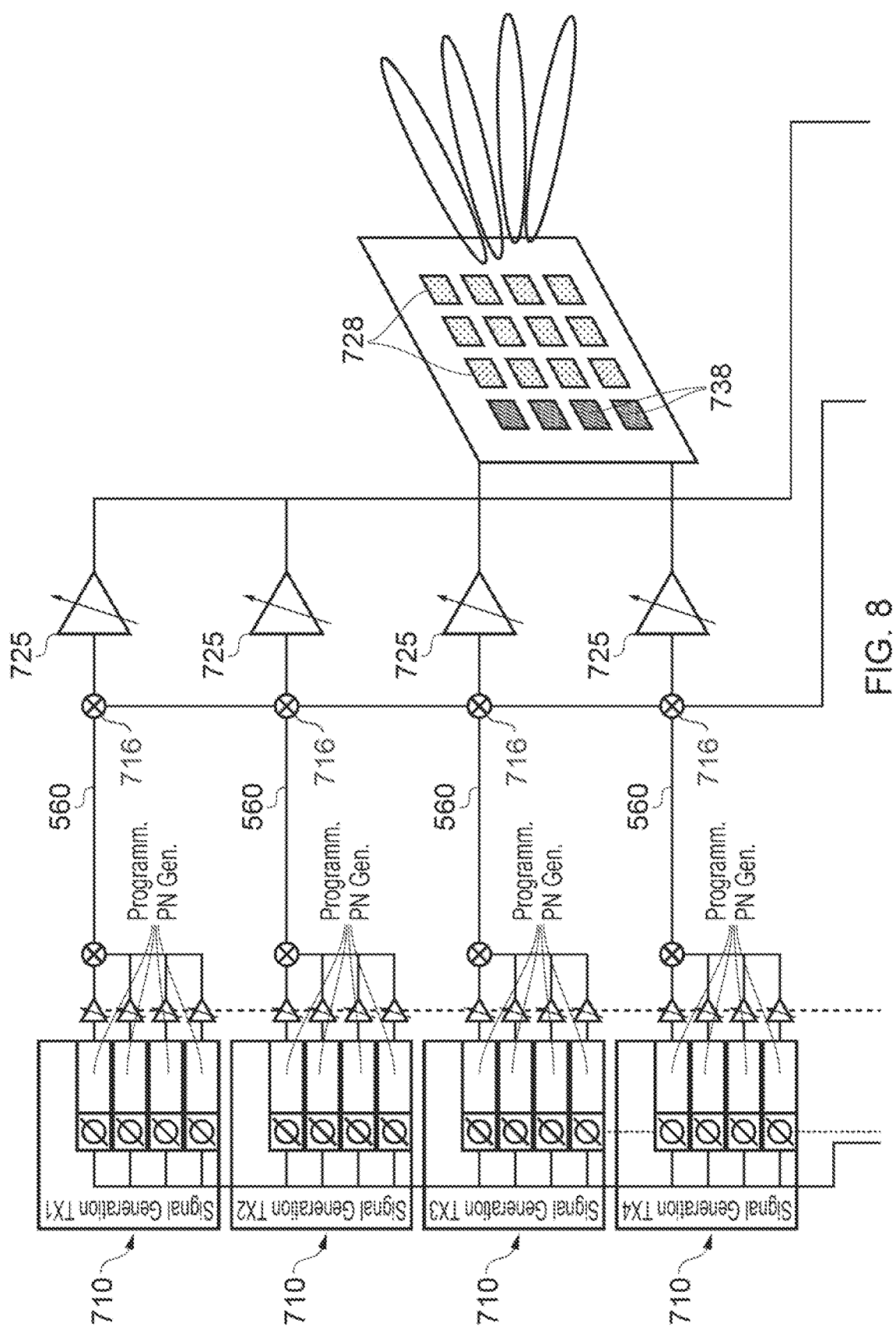

DIGITALLY MODULATED RADAR TRANSMITTER MODULES, SYSTEMS AND METHODS

CROSS-REFERENCE TO RELATED APPLICATIONS

This application claims the priority under 35 U.S.C. § 119 of European Patent application no. 19207102.5, filed on 5 Nov. 2019, the contents of which are incorporated by reference herein.

FIELD

The present disclosure relates to digitally modulated radar, DMR, and in particular to digitally modulated radar, DMR, transmitter modules, DMR systems, and to methods of generating a DMR signal.

BACKGROUND

In conventional radar systems a pulsed signal is transmitted from a transceiver, and reflected signals are received back at the transceiver. The reflected signals are analysed to provide distance and velocity information on the source of the reflection by analysing time-of-flight and Doppler effects. Both the dead time between pulses, and the problem of distinguishing between multiple, interfering, signals are limitations which may be addressed by the use of digitally modulated radar, DMR. In digitally modulated radar, instead of transmitting a simple high-frequency carrier signal, the carrier signal is modulated, according to a digital signal. The digital signal both provides an identification code by which reflections of the transmitted signals can be distinguished from interfering signals, and introduces variation in the time domain such that it is not necessary to include a dead time in order to determine a total time-of-flight of the transmitted and reflected signal.

However, modulation of a carrier signal by according to a digital signal introduces side lobes in the frequency domain. These side lobes may carry significant power, and this may be undesirable, or even unacceptable, in certain regulatory environments, for instance for applications such as 77 GHz automotive radar. It would be desirable to reduce the power or magnitude of these side lobes.

SUMMARY

According to a first aspect of the present disclosure there is provided a digitally modulated radar, DMR, transmitter module comprising: a sequence generator, configured to generate a repeating digital sequence signal based on a relatively low-frequency clock signal; a mixer configured to combine the digital sequence signal with at least one phase-delayed copy of the digital sequence signal, to provide a combined signal; and a modulator configured to modulate a relatively high-frequency carrier signal, in dependence on the combined signal, to provide a modulated signal. Combining the original repeating digital sequence signal, alters the positioning of and power in the side-lobes, associated with the transmitted modulated high-frequency signal, and may reduce the power in any individual side-lobe. There may be one, two, or more phase-delayed copies. They may be evenly separated in phase, or they may be irregularly spaced apart. Irregular phase-spacing may reduce the power in the side-lobe further, In one or more embodiments, the DMR transmitter module further comprises one or more phase-delay circuits, each phase-delay circuit being configured to receive as input the digital sequence signal, and provide to the mixer a respective one of the least one phase-delayed copy of the digital sequence signal, delayed in phase by a respective predetermined phase-shift.

In one or more other embodiments, the DMR transmitter module further comprises one or more phase-delay circuit, each phase-delay circuit being configured to receive as input the clock signal, and to output a respective copy of the clock signal, delayed in phase by a respective predetermined phase-shift; and one or more further sequence generators, each configured to generate a digital sequence signal based on a respective one of the at least one phase-delayed copy of the clock signal to provide a respectively phase-delayed copy of the digital sequence signal to the mixer. Such modules, in which the phase delay is applied to the clock signal, may be simpler to implement, compared with those in which the phase delay is applied to the digital sequence signal.

The modulator may be a phase shift key PSK modulator and the modulated signal a PSK modulated signal. The PSK modulated signal may a binary phase shift key, BPSK, signal. Phase shift key modulated signals, and in particular binary phase shift keys modulated signals, have been proven to be particularly effective as transmitted radar signals Nonetheless, in one or more other embodiments, the modulator is an amplitude modulator and the modulated signal is an amplitude modulated signal, or the modulator is a frequency modulator, and the modulated signal is a frequency modulated signal.

In one or more embodiments, the relatively high frequency carrier signal is derived from a local oscillator, and a one of the clock signal is derived from the local oscillator, or the local oscillator is derived from the clock signal. In general, it may be that it is easier to frequency-multiply a clock signal running at, for example, between 500 MHz and 4 GHz, to result in a higher relatively high-frequency carrier signal, running at for example 77 GHz or 140 GHz, rather than directly generate the relatively high frequency signal According to another aspect of the present disclosure, there is provided a DMR system, comprising a DMR transmitter module as above, and further comprising a receiver module, wherein the receiver module comprises: a down converter configured to down-convert a received signal to a baseline frequency; a track-and-hold circuit, and an analog-to-digital converter, ADC, configured to digitise portions of the down-converted received signal.

The receiver module further may comprise a cross-correlation unit configured to cross-correlate the portions of the down-converted received signal with the digital sequence signal.

According to yet further aspect, there is provided a method of generating a digitally modulated radar signal, the method comprising: generating a digital sequence, and, a repeating digital sequence signal based on the digital sequence and a relatively low-frequency clock signal; generating at least one phase-delayed copy of the digital sequence signal; combining the digital sequence signal, in a mixer, with at least one phase-delayed copy of the digital sequence signal, to provide a combined signal; and modulating a relatively high-frequency carrier signal, in dependence on the combined signal, to provide the digitally modulated radar signal.

In one or more embodiments, generating a one of the at least one phase-delayed copy of the digital sequence signal comprises: receiving, in a respective phase-delay circuit, the repeating digital sequence signal, delaying the phase by a respective predetermined phase-shift, and providing to the mixer the respective one of the least one phase-delayed copy of the digital sequence signal, In one or in other embodiments, generating a one of the at least one phase-delayed copy of the digital sequence signal comprises: receiving, in a respective phase-delay circuit, the clock signal, delaying the phase by a respective predetermined phase-shift, and outputting a phase-delayed copy of the clock signal; and generating a digital sequence signal, based on the digital sequence and the phase-delayed copy of the clock signal, to provide the one of the least one phase-delayed copy of the digital sequence signal to the mixer.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
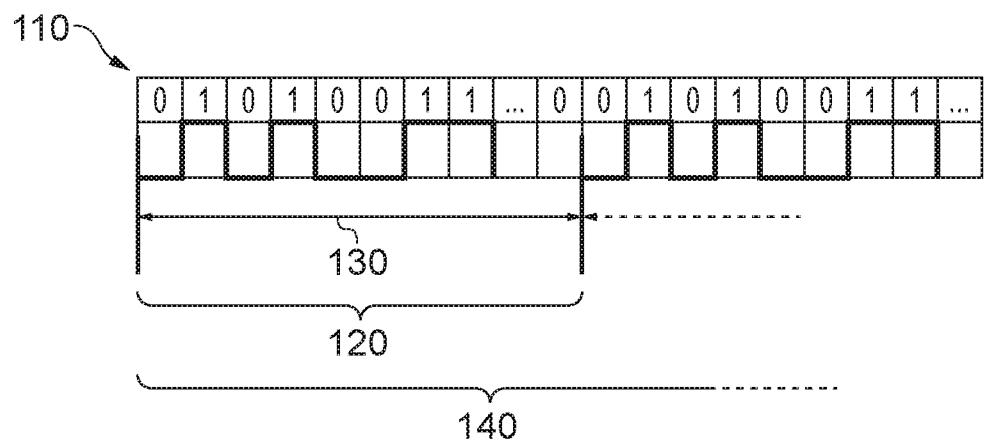
FIG. 1 shows an example of a digital sequence.

It should be noted that the Figures are diagrammatic and not necessarily drawn to scale. Relative dimensions and proportions of parts of these Figures may be shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows an example of a digital sequence, such as those used for DMR. The example digital sequence shown: {0, 1, 0, 1, 0, 0, 1, 1 . . . } is binary in this case, although the skilled person would appreciate that higher constellations, or other forms for the sequence are possible, such that other values than 0 or 1 may be used. In a typical radar application, the digital sequence may comprise $2^{12}$, or 4 k, bits; however other sequence lengths may be used.

The sequence is applied to a clock to generate a digital sequence signal 120. The clock may be running at a so-called baseline frequency, which may typically—but without limitation—be of the order of 500 MHz to 4 GHz. At a clock frequency of 4 GHz, a 4 k bit sequence, shown at 130, thus lasts approximately 1 ms. The sequence is repeated to generate a repeating digital sequence signal 140.

As will be familiar to the person skilled in the art of DMR, this repeating digital sequence signal 140 may be used to modulate a carrier signal to generate a radar transmission signal. The carrier signal has a frequency which is relatively higher than the baseline frequency. In the case of automotive radar, a frequency band centred on 77 GHz has been allocated by regulatory authorities, so this band is typically used. However, the present disclosure is not limited thereto: for example, again in the automotive field, another band around 140 GHz is also being considered for use.

The repeating digital sequence signal 140 is used to modulate the carrier signal. Most commonly the modulation is phase modulation, but the skilled person will be aware that other forms of modulation, such as amplitude modulation frequency modulation, are equally applicable. In the case of phase modulation, also known as phase shift keying (PSK), use of a binary digital signal such as that described above results in binary phase shift keying (BPSK); in the case of multilevel signals or high consolations, alternative forms of phase shift keying, such as Quaternary phase shift keying QPSK or n-QSPK, are equally applicable.

Figure 2:
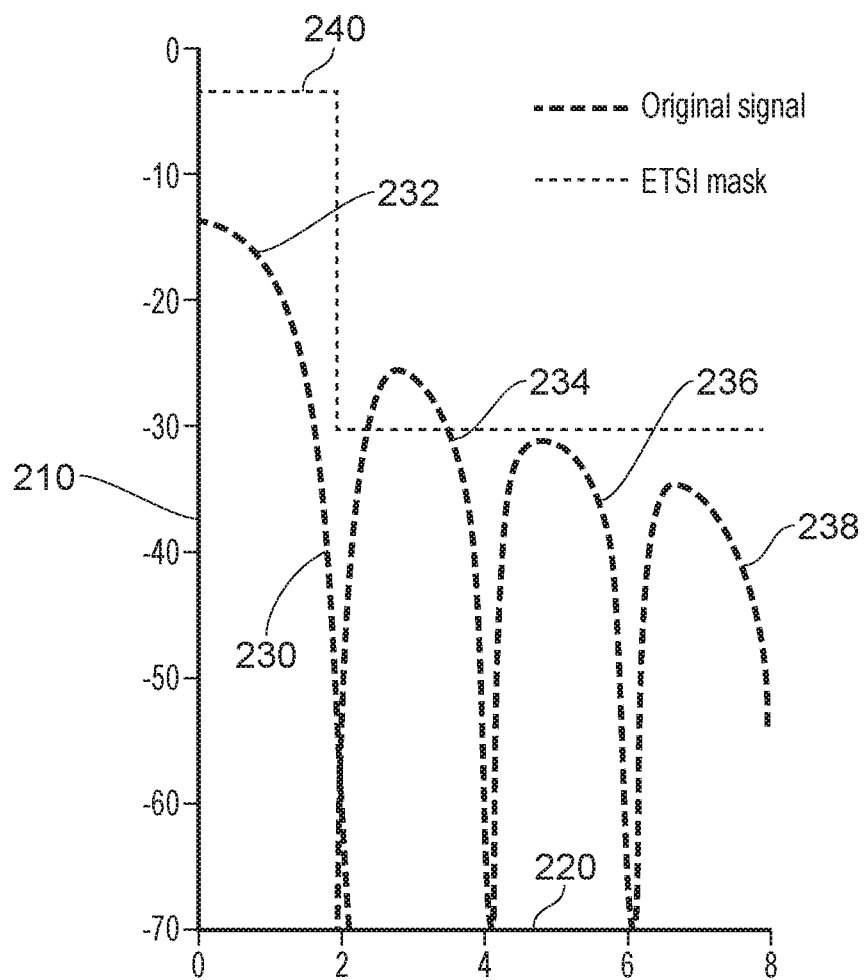
FIG. 2 shows the spectrum of a digital signal for a 77 GHz Automotive radar application.

Again, as will be familiar to the skilled person, modulating a carrier signal by a digital signal results in side lobes, when viewed in frequency domain. FIG. 2 shows the spectrum 230 of a digital signal for a 77 Ghz Automotive radar application. The figure shows the effective isotropic radiated power (EIRP) on the ordinate or y-axis 210 plotted against bandwidth on the abscissa or x-axis. The power is, as expected, highest at the carrier frequency, as shown by the main power peak 232, however, there is significant power in the side lobes, as shown at 234, 236 and 238, located approximately 3 GHz, 5 GHz and 7 GHz away from the central frequency.

Also shown in FIG. 2 is an example of a power mask 240. The power mask shows a power limit which may be either recommended or imposed, by regulatory bodies such as ETSI (European telecommunications standards Institute). As shown, the power mask may impose a requirement that the transmitted power, outside a narrow bandwidth (such as ±2 GHz as shown), is limited to a relatively low level (such as at least 30 dB lower than the peak signal, as shown). The imposition of a spectrum mask is generally intended to reduce the adjacent channel interference, by limiting excessive radiation at frequencies outside the required bandwidth. As can be seen from the figure, the side lobes of a DMR transmitted signal may exceed this limit.

It is known to attenuate these side lobes by using a bandpass filter, tuned to allow the correct centre frequency of the carrier wave together with necessary sidebands to properly convey the digital signal. The bandpass filter may be implemented with passive components; however this may be impractical in some applications in which monolithic integration is desired or required.

An alternative solution is to implement the bandpass filter in the digital domain. This may be done by applying a finite impulse response (FIR) filter in the signal generation chain. However, to implement this the signal has to be generated by a high-speed digital-to-analog converter (DAC) running at a higher speed than the bit rate of the signal to be generated. This in turn requires space on the silicon chip to implement the DAC and the FIR filter, and significant processing power and efforts to operate those IP blocks.

Figure 3A:
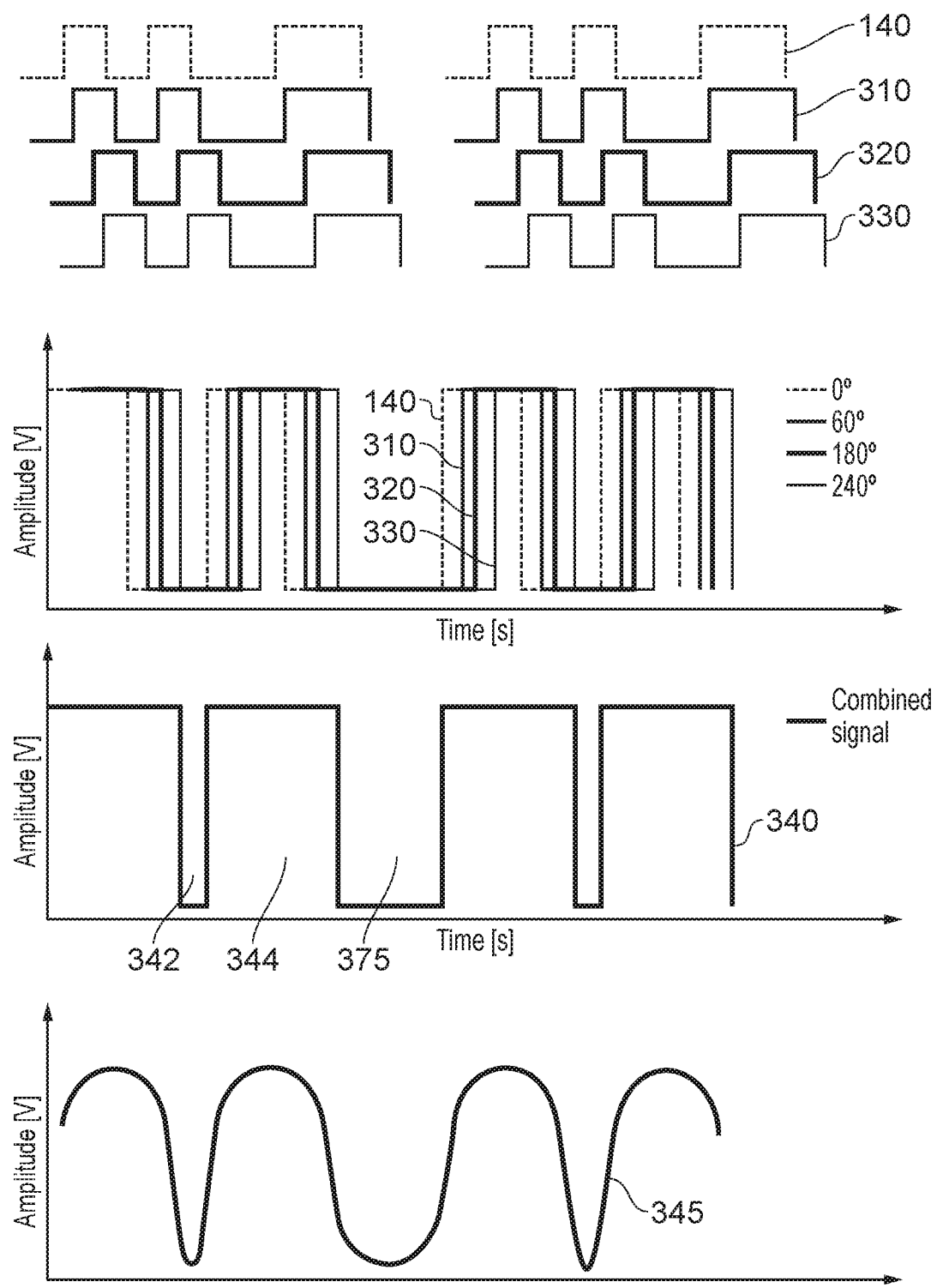
FIG. 3a shows a repeating binary digital sequence signal, with signal shaping according to one or more embodiments.
Figure 3B:
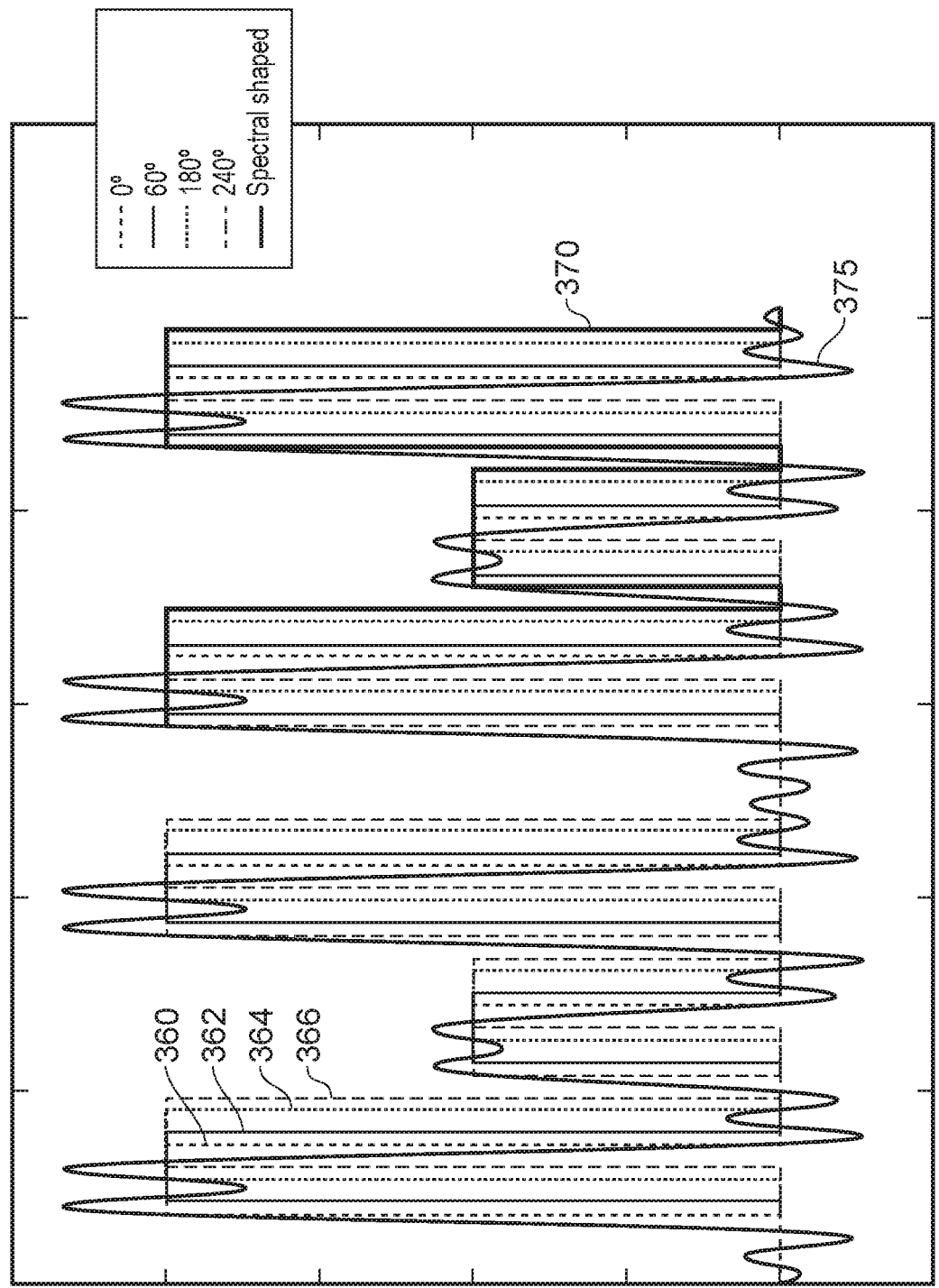
FIG. 3b shows a repeating 3-three digital sequence signal, with signal shaping according to one or more other embodiments.

FIG. 3a shows a repeating digital sequence signal, with signal shaping according to one or more embodiments. The repeating digital sequence signal 140 is the same as that shown in FIG. 1. This signal is combined with one or more copies of the signal. Three copies 310, 320, 330 are shown in this nonlimiting example. The signals are shown "exploded" at the top of the figure, and overlying each at the second part of the figure. As shown, the signals are phase-delayed, or phase-shifted copies of the original repeating digital sequence signal. That is to say the signals are identical except for the fact that the clocks for the signals have a relative phase difference. In the example shown, and with reference to the original repeating digital sequence signal, the phase delay is 60° for the first copy 310, 180° for the second copy 320, and 240° for the third copy 330.

The signals are then combined to provide a combined signal, which may be plotted as amplitude against time as shown at 340, in the third part of the figure. In the case of the binary signal, the combination is done such that the combined signal is "high", or "1" whenever any one or more of the individual signals are "high" or "1", and only "low" or "0", when all of the individual signals are "low" or "0". As a result, a single "0" bit in the original signal results in a much shorter "0" time in the combined signal, as shown at 342, and a single "1" bit in the original signal results in a longer "1" time in the combined signal, as shown at 344. It will be observed that where a bit is followed by another bit of the same parity (such as the two "0"s shown at 346), one of the bits is unaffected. This is the second bit in the case of two consecutive "0"s. In the case of two consecutive "1"s, it will be the first bit which is unaffected.

Finally, the bottom part of the figure shows the signal 345, after smoothing. It will be appreciated that the "square wave" digital signals shown at the top of the figure are idealised. In any practical circuit the sharp transitions—shown as being instantaneous in the upper part of the figure—between the high and low states do not occur, and the signal transitions are rounded. By including phase-delayed copies of the signal, the irregularity of the spacing of the transitions is increased, and an effect of this is to smooth the transitions between levels. It will increase the slope of the transition and will round the square signal, in such a way as to reduce the spectral components.

FIG. 3*a* shows a repeating digital sequence signal, with signal shaping according to one or more other embodiments. An original three-level signal 360 is combined with phase-delayed copies—in this example 3 such copies 362, 364, and 368. In this particular nonlimiting example the phase delays are 60°, 180° and 240° respectively. The resulting signal has increased irregularity between the level transitions as shown by the idealised signal 370. And the resulting signal achieved in practice after the unavoidable, and indeed desirable, smoothing of the transitions is shown at 375.

Figure 4:
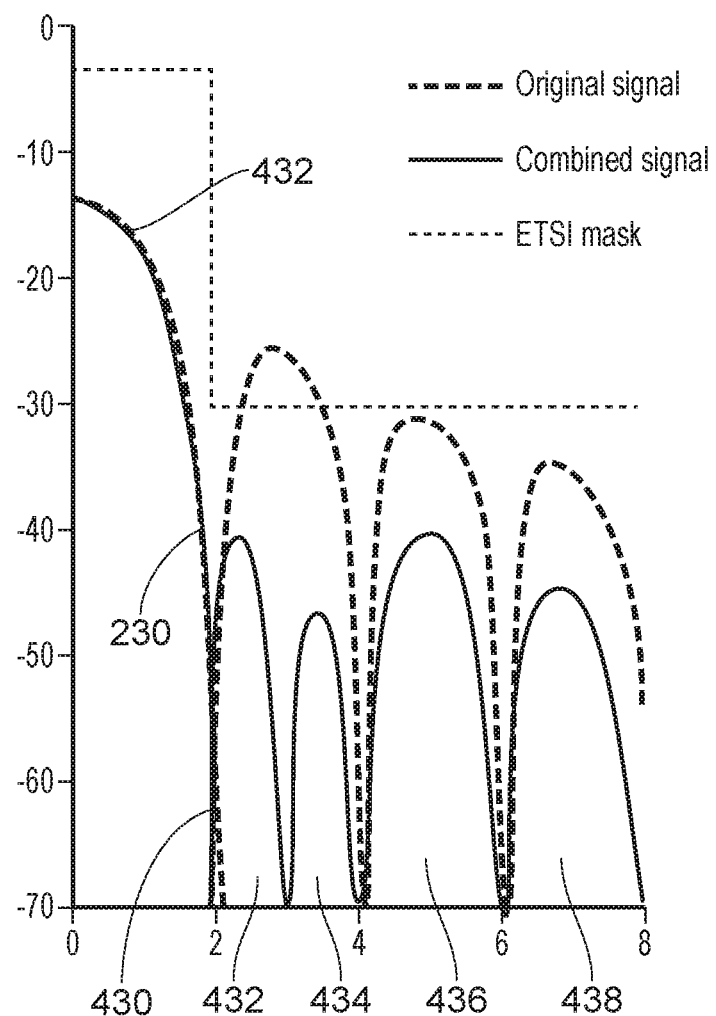
FIG. 4 shows the spectrum of a carrier signal modulated by the combined signal.

FIG. 4 shows the spectrum of a carrier signal modulated by the combined signal 340. The spectrum 230 of a original digital signal is shown, along with the spectrum of the combined signal 430. As can be seen, the shape of the main peak 432 for the combined signal is unchanged relative to the original signal; however the side lobes 434, 436, 438, 439 have different centre-frequencies, and have a lower magnitude, relative to the side lobes of the original signal.

The exact extent of the reduction in the power in the side lobes depends on the digital sequence, the number phase-delayed copies of the repeated digital sequence signal which are combined with the original repeated digital sequence signal, and the choice of phase delays. At present it is not possible to mathematically calculate the optimum phase delays for a given number of copies and a range of digital sequences.

It will be appreciated that the choice of the digital sequence used in a system depends on several criteria. Apart from the sequence length, already mentioned above, two important factors are auto-correlation and cross-correlation. In general for radar applications, it is desired to have minimum, and preferably zero, cross-correlation between two sequences which either are in the same system, or in two systems which are expected to operate in the same physical space and thus potentially are going to interfere. As used in the field of radar, cross-correlation is a mathematical function corresponding to the result of convolving two sequences or signals. Perfect cross-correlation—corresponding to a correlation level of "1"—results if the sequences are identical; conversely, zero cross-correlation—corresponding to a correlation level of "0"—results if the sequences are completely unrelated. The lower the cross-correlation, the lower the probability that a receiver will incorrectly identify a signal carrying one sequence as being a signal carrying the other sequence, or a reflected version of that signal. For two sequences to have zero cross-correlation they must be completely orthogonal, and it will be appreciated that this is only the case in an infinitely long sequence. The shorter the sequence, the higher the cross-correlation with any other sequence. The choice of sequence length thus is a compromise with the degree of cross-correlation which is tolerable.

Considering now auto-correlation, for perfect auto-correlation, the sequence should be infinitely long. Conceptually, autocorrelation relates to the extent to which a sequence corresponds to a time shifted copy of itself. Perfect auto-correlation—corresponding to a correlation level of "1" results if the sequence is perfectly matched with the time shifted sequence—giving absolute in confidence that the time-shifted sequence originated with (for example it is a reflection from) the original sequence; conversely, zero auto-correlation—corresponding to a correlation level of "0", results if the sequence is entirely unrelated to the time shifted sequence, from which it can be concluded that the time-shifted sequence did not originate from the original sequence, and thus is comes from an interfering signal. In the field of radar, the autocorrelation function is not a discrete signal: if there is a match in the autocorrelation due to a reflected signal, delayed relative to transmitted signal, but having the same sequence, a delta Dirac in the autocorrelation will be generated. The level of the delta Dirac will depend on the magnitude of the reflected signal.

It will thus be appreciated that a phase-delayed copy of the original sequence has a very high level of auto-correlation with the original sequence. This is significant, since it greatly simplifies the processing requirements of signals received by a radar receiver in order to identify and analyse reflections of the transmitted signal, as will be discussed in more detail below.

Returning now to the issue of the choice of number and phase delay of the phase-delayed copies of the repeating digital sequence signal, as has already be mentioned it is likely not possible to mathematically calculate the optimum number and phase delays. However, it has been found experimentally that, in general, an increasing number of copies results in lower side lobes, as does irregular spacing of the phase delay. Conceptually, this may be explained as follows: it is known that a pure square wave signal has very high harmonic components, particularly when compared with a sine wave signal which has only the fundamental frequency component. The original repeating digital sequence signal corresponds closely to a square wave signal, and this has high harmonic content. By combining the sequence with phase-delayed versions of the sequence, it is made to be less similar to a square wave, and this results in a reduction of the harmonic content.

Figure 5:
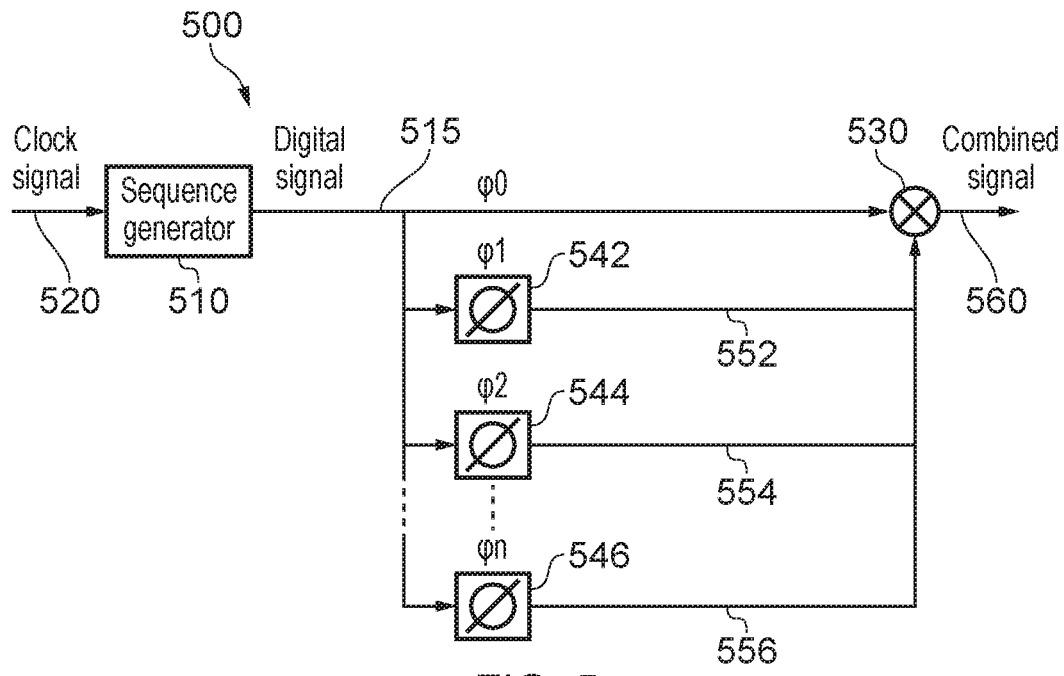
FIG. 5 shows a baseline frequency part of a module according to one or ore embodiments.
Figure 6:
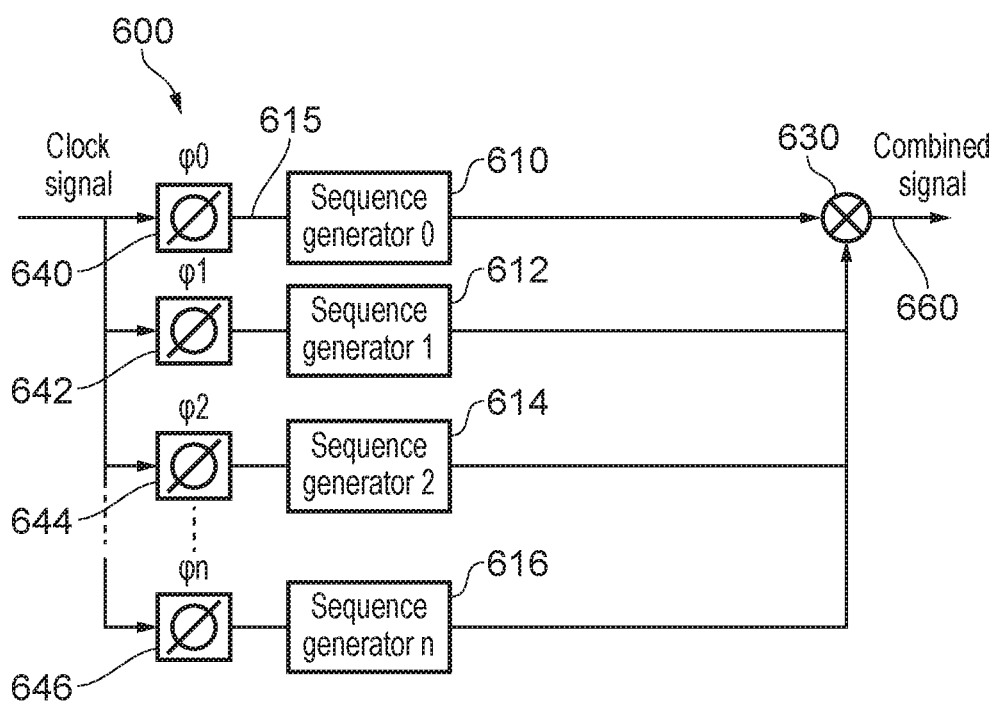
FIG. 6 shows a baseline frequency part of a module according to other embodiments.

Turning now to FIGS. 5 and 6, according a first aspect of the present disclosure, there is provided a digitally modulated radar, DMR, transmitter module comprising: a sequence generator 510, 610, configured to generate a repeating digital sequence signal 515, 615 based on a relatively low-frequency clock signal 520, 620. The module further include a mixer 530, 630 configured to combine the digital sequence signal with at least one phase-delayed copy of the digital sequence signal, to provide a combined signal 560, 660; and a modulator (not shown in FIGS. 5 and 6) configured to modulate a relatively high-frequency carrier signal, in dependence on the combined signal, to provide a modulated signal.

Considering now specifically FIG. 5, this shows an example of the baseline frequency part 500 of a module, in which there are one or more phase-delay circuits 542, 544, 546, each phase-delay circuit being configured to receive as input the digital sequence signal 515, and provide to the mixer a respective one of the least one phase-delayed copy 552, 554, 556 of the digital sequence signal, delayed in phase by a respective predetermined phase-shift ($\varphi0$-$\varphi1$), ($\varphi$-$\varphi2$), ($\varphi0$-$\varphi n$). The mixer may be implemented as an XOR gate. Thus in such an embodiment, a single code generator is used, and the shifted versions are generated by delaying the original signal with phase shifters. Although there are a variety of known methods of implementing the phase shifters required for such embodiments, the skilled person will appreciate that this may be challenging or take a lot of silicon real estate and/or power to implement such phase shifters at the frequencies involved (which, as mentioned above may be of the order of 4 GHz): the digital sequence is applied to the clock signal results in ultra-wideband, or UWB signals, and the skilled person will appreciate that phase shifting a UWB signal is not trivial.

Turning now to FIG. 6, this shows an example of the baseline frequency part 600 of a module further comprises: one or more phase-delay circuits 642, 644, 646, each phase-delay circuit being configured to receive as input the clock signal, and to output a respective copy of the clock signal, delayed in phase by a respective predetermined phase-shift ($\varphi1$-$\varphi0$), ($\varphi2$-$\varphi0$), and ($\varphi n$-$\varphi0$). The skilled person will appreciate that the shown phase-delay circuit 640 giving a phase shift $\varphi0$ is optional. Including such a circuit results in matching paths for all the signals; $\varphi0$ may be set to 0. It may, however, be omitted, in which case the phase shifts for phase-delay circuits 642, 644 and 646 would be $\varphi1$, $\varphi2$ and $\varphi03$ respectively. Such embodiment also comprises one or more further sequence generators 612, 614, 616 (in addition to the sequence generator 610), each configured to generate a digital sequence signal based on a respective one of the at least one phase-delayed copy of the clock signal to provide a respectively phase-delayed copy of the digital sequence signal to the mixer. That is to say, each signal generated is triggered by its own, separate clock signal. The phase shifts can be achieved by shifting the phase of each clock. Thus the phase shifters in such as embodiments may be of low complexity relative to that in shown in FIG. 5

Figure 7:
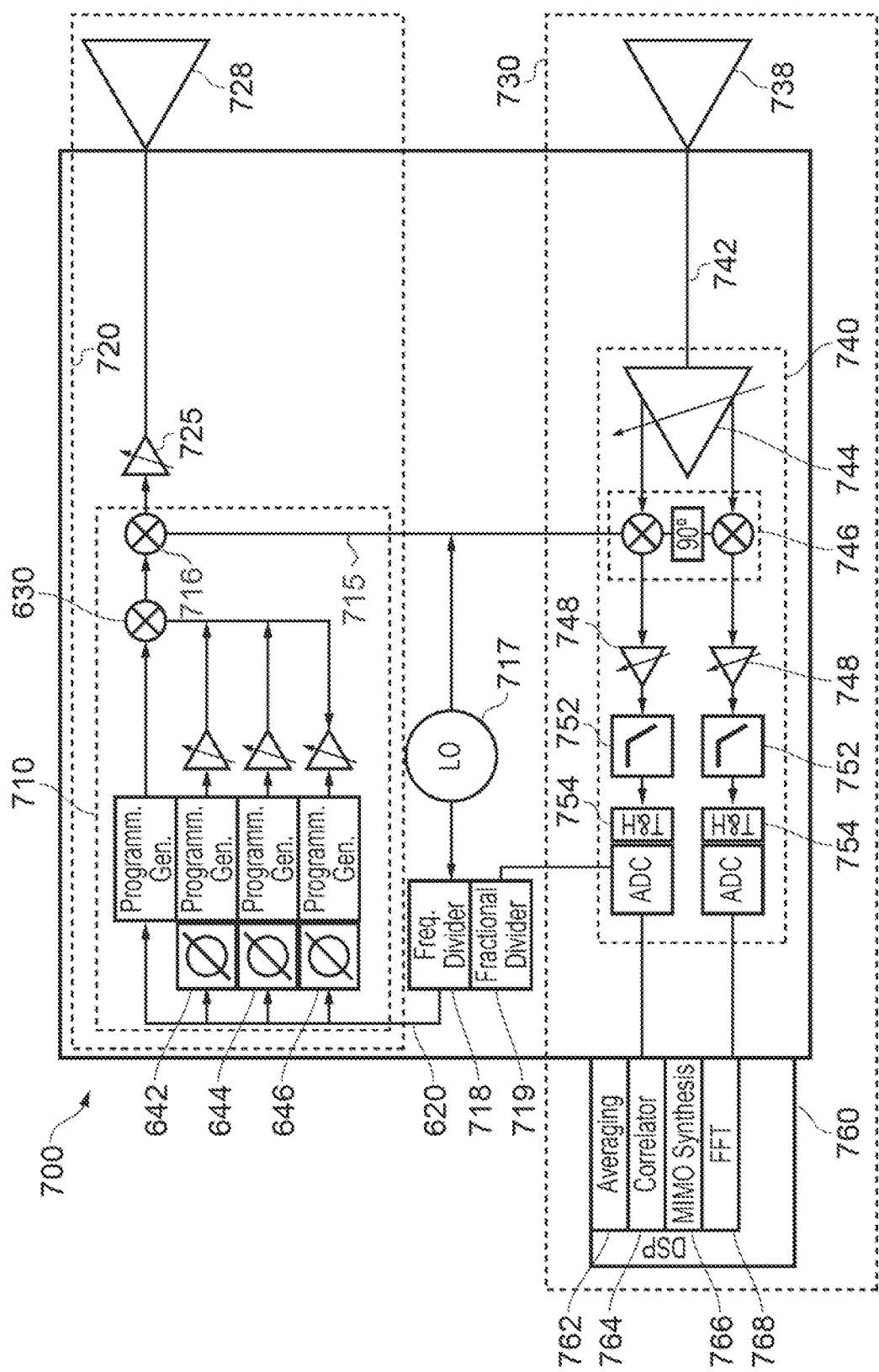
FIG. 7 shows a DMR system according to one or more embodiments.

Turning now to FIG. 7, this figure shows a generally a DMR system 700, comprising a DMR transmitter 720 and a receiver module 740, wherein the receiver module comprises: a down converter configured to down-convert a received signal to a baseline frequency; a track-and-hold circuit, and an analog-to-digital converter, ADO, configured to digitise portions of the down-converted received signal, as well as a digital signal processing module.

The DMR transmitter 720 comprises a transmitter module 710, having one or more—in this example three—phase delay circuits 642, 644 and 646, configured to delay the phase of a clock signal 620. The transmitter module 600 includes sequence generators 610, which applies a digital sequence to the incoming clock signal, as well as sequence generators 612, 614 and 616 which apply the digital sequence to respectively phase-delayed versions of the clock signal, to result in an original repeating digital sequence signal, together with three phase-delayed versions of the repeating digital sequence signal, as discussed above with respect to FIG. 6. The original repeating digital sequence signal is combined with the three phase-delayed versions, again as discussed above, by mixer 630. This combined baseline signal is then used at the modulator 716 to modulate a relatively high-frequency carrier signal 715. The modulated carrier signal output from the transmitter module 710 is amplified by a variable gain amplifier 725 and is transmitted by means of an antenna 728.

The relatively high-frequency carrier signal 715 may be provided by means of a local oscillator 717. In a nonlimiting example, the local oscillator may be operating at the relatively high frequency (which may for instance be 77 GHz) The output from the local oscillator may be frequency divided in a frequency divider 718 to the baseline frequency (which may be for instance be between 500 MHz and 4 GHz). The frequency divider may include or be associated with a fractional divider 719. As the skilled person will be aware, in other embodiments, the relatively high-frequency carrier signal may be provided by frequency multiplying a clock signal. The clock signal may be operating at the baseline signal which, in another nonlimiting example, may be between 500 MHz and 4 GHz.

Reflections from the transmitted modulated carrier signal along with other interfering, or spurious, signals are received at an antenna 738 which forms part of the receiver 730. Along with the antenna 738, the receiver 730 comprises a receiver module 740 as well as a digital signal processing (DSP) unit 760.

The receiver module 740 receives the incoming signal from antenna 738, and processes it in a conventional manner. In particular, after being amplified by a variable gain amplifier 744, the signal is down-converter into real and quadrature components with a phase difference of 90° therebetween, by downconverter 446. The downconverter makes use of the relatively high frequency carrier signal 715. The real and quadrature components of the downconverter signal may be amplified in variable gain amplifiers 748 and filtered in low-pass filters 752. The filtered baseband signal may digitized with an effective sampling frequency of twice the bandwidth of the signal. For example, to do this the frequency-divided LO signal may be used to drive a track and hold amplifiers 754 in a normal sampling way. Alternatively, the frequency-divided LO signal can be further divided in frequency by a factor k (to provide a signal which is a factor of K lower in frequency than the baseline frequency): in this way, the signal is subsampled: in other words, the signal is sampled with an instantaneous sampling frequency lower than the indicated by the Nyquist theorem but the signal will be repeated k times in order to sample a part of the signal in every repetition.

The receiver also includes a DSP module 760. The DSP module 760 may be part of a microcontroller, (It should be noted that in one or more other embodiments, the DSP module and/or the microcontroller may be separate to receiver; it may be part of a central processing unit).

The DSP module 760 carries out functions required for DMR signal processing. In particular, after the signal has been digitized, it can be averaged by using a coherent adder 762, in order to increase the SNR of the system and after the signal will be cross correlated with the original digital sequence used at the transmitter 764. If there are multiple transmitters, each transmitter can use a different orthogonal digital signal and therefore, at each receiver, the same amount of cross correlators have to be implemented. In this way a MIMO system is built and all the transmitters can transmit at the same time allowing to reconstruct the response of each TX channel on each RX channel which is an advantage to increase the angular resolution of the radar system by using the same amount of physical TX/RX but allowing to reconstruct virtual RX channels with the cross correlators. This is shown as MIMO synthesis 766 in FIG. 7. The cross correlation function shows the range of all the targets. Note that for each TX spectrum shaping system is built. Finally, fast Fourier transform techniques are applied as shown in 768 in order to obtain frequency spectrum information, from which speed of targets may be assessed using Doppler techniques, as will be familiar to those skilled in the art.

It will be appreciated that, according to embodiments of the present disclosure, the received baseband signal which is used for the radar processing is not a simple copy of the original digital sequence signal, not only may there be Doppler effects as would be the case in conventional DMR radar, according to embodiments, the received signal is a combination of multiple, phase-delayed versions of the original digital sequence signal. Whereas this might be expected to add additional complexity to the processing, in practice this is not the case: since the received signal is based on multiple copies of the same digital sequence, these appear to the correlators simply as additional, time shifted, copies of the original signal which are readily identifiable. The correlator can be implemented as a match filter, in the form of a finite impulse response (FI filter to the incoming signal.

Figure 8:
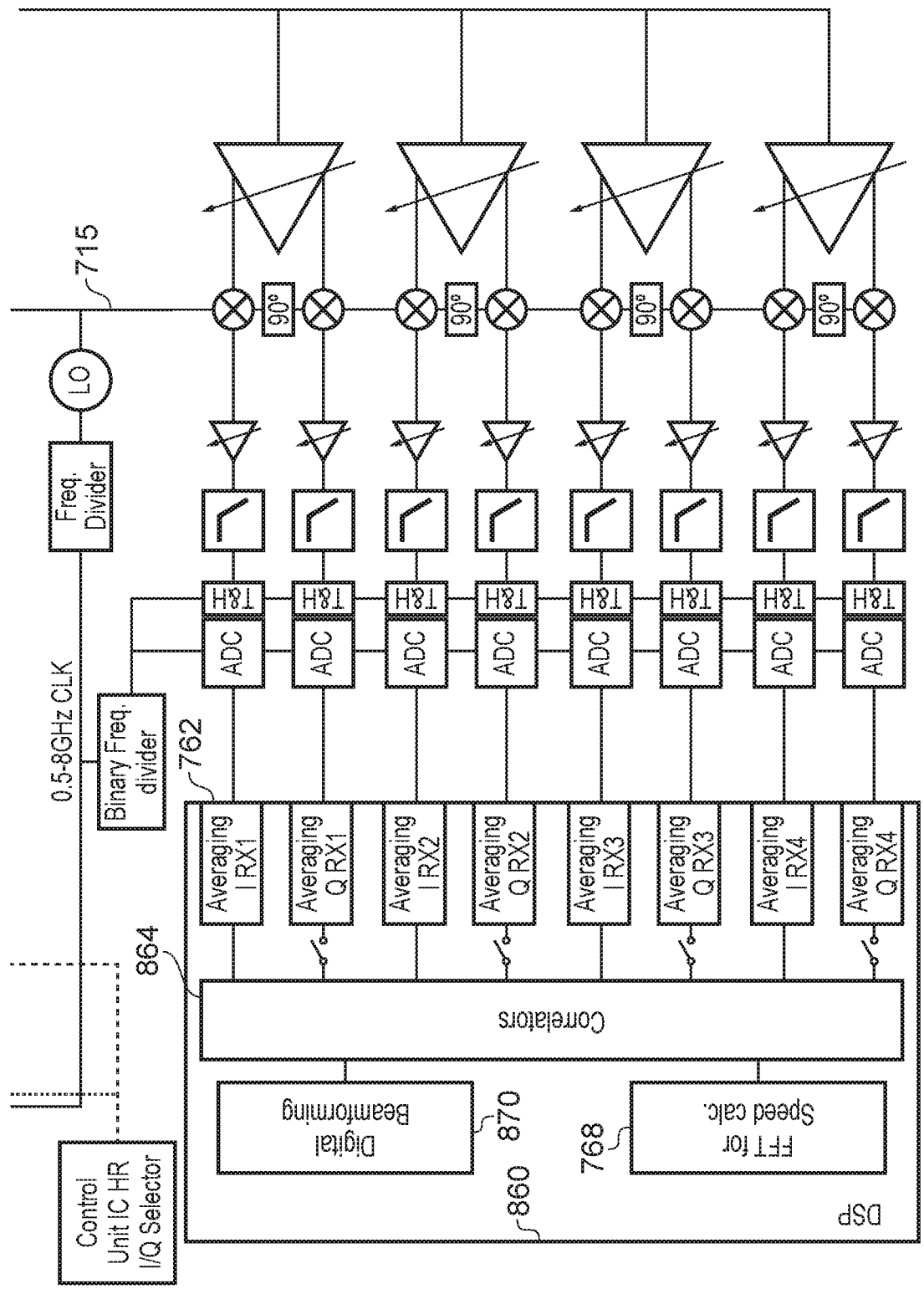
FIG. 8 shows a MIMO DMR system according to one or more embodiments.

Turning now to FIG. 8, this figure shows a generally multiple input multiple output (MIMO) DMR system 800, according to one or more embodiments. In a MIMO DMR system, there are multiple transmitter modules 710—four are shown in this particular example. The resulting 4 repeating digital sequence signals, each having a separate, orthogonal, digital sequence associated therewith, are each used to modulate the carrier signal 715, and after amplification in respective variable gain amplifier 725, are transmitted from separate antennas 728.

Reflected signals, along with any interfering signals, are received by two or more antennas 738 four are shown in this particular example. The combination of N transmitters and M receivers results in N×M combinations—in the example shown this is 4×4 resulting in 16 combinations. As shown, each receiver includes a receiver module such as that shown in FIG. 7 at 740. The DSP module 860 is again generally similar to that shown in FIG. 7. The correlators may be based on, without limitation, Fast Hadamard Transformations (FHT) 864 or other techniques such as will be well known to those skilled in the art of radar processing. An additional processing feature which is made available by MIMO is that of digital beam forming 870 in order to provide angle of arrival information to improve the localisation of individual targets, again as will be well known to those skilled in the art of radar processing.

From reading the present disclosure, other variations and modifications will be apparent to the skilled person. Such variations and modifications may involve equivalent and other features which are already known in the art of DMR and which may be used instead of, or in addition to, features already described herein.

As used herein, the terms phase-delayed copy of a signal, (or in general phase-shifted copy of a signal), refers to a signal which has the same content as the original signal, but is delayed (or shifted, respectively) in time. Thus if a signal has a fundamental frequency of for instance 1 GHz, it has a primary period of 1 ns. A phase-delayed copy of that signal which has a phase delay of 90°, would thus lag the original signal by (90°/360°)×1 ns, that is to say 250 ps, and a phase-delayed copy of that signal which has a phase delay of 270° would lag the original signal by (270°/360°)×1 ns, or 750 ps.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

What is claimed is:

1. A digitally modulated radar (DMR) transmitter module comprising:
   a sequence generator, configured to generate a repeating digital sequence signal based on a clock signal;
   a mixer configured to combine the repeating digital sequence signal with at least one phase-delayed copy of the repeating digital sequence signal, to provide a combined signal, where the phase-delayed copy of the repeating digital sequence signal has an auto-correlation with the repeating digital sequence signal; and
   a modulator configured to modulate a relatively high-frequency carrier signal, in dependence on the combined signal, to provide a modulated signal.

2. The DMR transmitter module of claim 1, further comprising:
   one or more phase-delay circuits, each phase-delay circuit being configured to receive as input the repeating digital sequence signal, and to provide to the mixer a respective one of the least one phase-delayed copy of the repeating digital sequence signal, delayed in phase by a respective predetermined phase-shift.

3. The DMR transmitter module of claim 1, further comprising:
   one or more phase-delay circuits, each phase-delay circuit being configured to receive as input the clock signal, and to output a respective phase-delayed copy of the clock signal, delayed in phase by a respective predetermined phase-shift; and
   one or more further sequence generators, each configured to generate a digital sequence signal based on a respective phase-delayed copy of the clock signal to provide a respectively phase-delayed copy of the digital sequence signal to the mixer.

4. The DMR transmitter module of claim 1, wherein the modulator is a phase shift key (PSK) modulator and the modulated signal is a PSK modulated signal.

5. The DMR transmitter module of claim 4, wherein the PSK modulated signal is a binary phase shift key (BPSK) signal.

6. The DMR transmitter module of claim 1, wherein the modulator is an amplitude modulator and the modulated signal is an amplitude modulated signal.

7. The DMR transmitter module of claim 1, wherein the relatively high-frequency carrier signal is derived from a local oscillator, and where the clock signal is derived from the local oscillator, or the local oscillator is derived from the clock signal.

8. A DMR system, comprising the DMR transmitter module of claim 1, and further comprising a receiver module, wherein the receiver module comprises:
a down converter configured to down-convert a received signal to a baseline frequency; and
an analog-to-digital converter (ADC) configured to digitise portions of the down-converted received signal.

9. The DMR system of claim 8, wherein the receiver module further comprises
a cross-correlator configured to cross-correlate the portions of the down-converted received signal with the digital sequence signal.

10. A method of generating a digitally modulated radar signal, the method comprising:
generating a digital sequence signal from a repeating digital sequence and a clock signal;
generating at least one phase-delayed copy of the digital sequence signal;
combining the digital sequence signal, in a mixer, with at least one phase-delayed copy of the digital sequence signal, to provide a combined signal, where the phase-delayed copy of the digital sequence signal has an auto-correlation with the digital sequence signal; and
modulating a relatively high-frequency carrier signal, in dependence on the combined signal, to provide the digitally modulated radar signal.

11. The method of claim 10, wherein generating at least one phase-delayed copy of the digital sequence signal comprises:
receiving, in a respective phase-delay circuit, the digital sequence signal,
generating a phase-delayed copy of the digital sequenced signal that is delayed in phase by a respective predetermined phase-shift, and
providing to the mixer the phase-delayed copy of the digital sequence signal.

12. The method of claim 10, wherein generating at least one phase-delayed copy of the digital sequence signal comprises:
receiving, in a respective phase-delay circuit, the clock signal, generating a phase-delayed copy of the clock signal that is delayed in phase by a respective predetermined phase-shift, and outputting the phase-delayed copy of the clock signal; and
generating at least one phase-delayed copy of digital sequence signal based on the digital sequence signal and the phase-delayed copy of the clock signal.

13. The method of claim 10, wherein the modulator is a phase shift key (PSK) modulator and the modulated signal is a PSK modulated signal.

14. The method of claim 10, wherein the PSK modulated signal is a binary phase shift key (BPSK) signal.

15. The method of claim 10, wherein the modulator is an amplitude modulator and the modulated signal is an amplitude modulated signal.

16. A digitally modulated radar (DMR) system comprising:
a transmitter module comprising:
a sequence generator, configured to generate a digital sequence signal based on a clock signal;
a mixer configured to combine the digital sequence signal with at least one phase-delayed copy of the digital sequence signal to provide a combined signal, where the phase-delayed copy of the digital sequence signal has an auto-correlation with the digital sequence signal; and
a modulator configured to modulate a relatively high-frequency carrier signal, in dependence on the combined signal, to provide a modulated signal; and
a receiver module comprising:
a down converter configured to down-convert a received signal to a baseline frequency;
an analog-to-digital converter (ADC) configured to digitise portions of the down-converted received signal; and
a cross-correlator configured to cross-correlate the portions of the down-converted received signal with the digital sequence signal.

17. The DMR system of claim 16, further comprising:
one or more phase-delay circuits, each phase-delay circuit being configured to receive as input the digital sequence signal, and to provide to the mixer a respective one of the at least one phase-delayed copy of the digital sequence signal, delayed in phase by a respective predetermined phase-shift.

18. The DMR system of claim 16, further comprising:
one or more phase-delay circuits, each phase-delay circuit being configured to receive as input the clock signal, and to output a respective copy of the clock signal that is delayed in phase by a respective predetermined phase-shift; and
one or more further sequence generators, each configured to generate a digital sequence signal based on a respective copy of the clock signal that is delayed in phase to provide a respectively phase-delayed copy of the digital sequence signal to the mixer.

19. The DMR system of claim 16, wherein the modulator is a phase shift key (PSK) modulator and the modulated signal is a PSK modulated signal.

20. The DMR system of claim 19, wherein the PSK modulated signal is a binary phase shift key (BPSK) signal.

* * * * *